US006887521B2

(12) United States Patent
Basceri

(10) Patent No.: US 6,887,521 B2
(45) Date of Patent: *May 3, 2005

(54) GAS DELIVERY SYSTEM FOR PULSED-TYPE DEPOSITION PROCESSES USED IN THE MANUFACTURING OF MICRO-DEVICES

(75) Inventor: Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 224 days.

This patent is subject to a terminal disclaimer.

(21) Appl. No.: 10/222,290

(22) Filed: Aug. 15, 2002

(65) Prior Publication Data

US 2004/0083961 A1 May 6, 2004

(51) Int. Cl.⁷ ............................................. C23C 16/00
(52) U.S. Cl. ............................. 427/248.1; 427/255.7; 438/680
(58) Field of Search ...................... 427/248.1, 255.7; 438/680

(56) References Cited

U.S. PATENT DOCUMENTS

| 6,305,314 B1 | | 10/2001 | Sneh et al. | |
| 6,419,462 B1 | * | 7/2002 | Horie et al. | 417/394 |
| 2002/0164420 A1 | * | 11/2002 | Derderian et al. | 427/248.1 |
| 2003/0194862 A1 | * | 10/2003 | Mardian et al. | 438/680 |
| 2004/0124131 A1 | * | 7/2004 | Aitchison et al. | 210/252 |

OTHER PUBLICATIONS

U.S. Appl. No. 09/805,620, filed Mar. 13, 2001, Carpenter et al.
U.S. Appl. No. 09/810,387, filed Mar. 15, 2001, Carpenter et al.
UC Berkeley Extension, Engineering, "Atomic Layer Deposition," Dec. 11, 2001, 5 pages, http://www.unex.berkeley.edu/eng/br335/1–1.html.

(Continued)

Primary Examiner—Timothy Meeks
(74) Attorney, Agent, or Firm—Perkins Coie LLP

(57) ABSTRACT

Methods for depositing material onto workpieces, methods of controlling the delivery of gases in deposition processes, and apparatus for depositing materials onto workpieces. One embodiment of a method for depositing material onto a workpiece comprises placing a micro-device workpiece having a plurality of submicron features in a reactor proximate to outlet ports of a gas distributor in the reactor. This method also includes flowing a gas from a gas supply to a closed compartment of the reactor until the gas reaches a desired pressure within the compartment, and subsequently dispensing the gas from the outlet ports of the gas distributor. The compartment can be in a reaction chamber of the reactor or outside of the reaction chamber. The gas can be dispensed from the outlet ports by opening an outlet valve between the compartment and the outlet ports while also physically displacing the gas from the compartment. The gas can be displaced from the compartment using a piston, diaphragm, bladder or other type of mechanical actuator. In other embodiments, the gas is displaced from the compartment by driving another type of gas through the compartment while the outlet valve is open. As a result, a known volume or mass of the gas is actively displaced from the compartment by driving the gas out of the compartment with a driver that is separate from the gas itself.

38 Claims, 7 Drawing Sheets

OTHER PUBLICATIONS

IPS Integrated Process Systems, Dec. 11, 2001, 1 page, http://www.ips–tech.com/eng/main.htm.

IPS Integrated Process Systems, Nano–ALD, Dec. 11, 2001, 2 pages, http://www.ips–tech.com/eng/pro–p2.htm.

IPS Integrated Process Systems, Nano–ALD, Dec. 11, 2001, 2 pages, http://www.ips–tech.com/eng/pro–p2–2.htm.

Deublin Company, Precision Rotating Unions, Steam Joints and Siphon Systems "Precision Rotating Connections for Water, Steam, Air, Hydraulic, Vacuum, Coolant and Hot Oil Service," http://www.deublin.com, Feb. 4, 2002, 1 page.

Deublin Company, "Rotating Unions," http://www.deublin.com/products/rotatingunions.htm, Feb. 4, 2002, 1 page.

Deublin Company, "Sealing," http://www.deublin.com/products/sealing.htm, Feb. 4, 2002, 2 pages.

Electronics Times, "Atomic Layer Deposition Chamber Works at Low Temperatures," 2 pages, Dec. 11, 2001, 2001 CMP Europe Ltd., http://www.electronicstimes.com/story/OEG20010719S0042.

The University of Adelaide Australia, Department of Chemistry, Stage 2 Chemistry Social Relevance Projects, "Spectroscopy," 2 pages, Feb. 9, 2002, http://www.chemistry.adelaide.edu.au/external/Soc–Rel/content/Spectros.htm.

* cited by examiner

GAS DELIVERY SYSTEM FOR PULSED-TYPE DEPOSITION PROCESSES USED IN THE MANUFACTURING OF MICRO-DEVICES

TECHNICAL FIELD

The present invention is related to depositing thin films and, in particular, gas delivery systems used in pulsed-type deposition processes for manufacturing microelectronic devices, micromechanical devices, and other types of micro-devices.

BACKGROUND

Thin film deposition techniques are widely used to form layers of specific materials in the fabrication of semiconductor devices and other micro-devices. The size of the individual components in the devices is constantly decreasing, and the number of layers in the devices is increasing. As a result, the density of components and the aspect ratios of depressions (e.g., the ratio of the depth to the size of the opening) are increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed in a gas or vapor state, and then the precursor mixture is presented to the surface of the workpiece. CVD systems can be continuous flow systems or pulsed-type CVD systems. Continuous flow systems provide a continuous flow of the precursor gases. Pulsed-CVD systems intermittently pulse a mixture of the precursor gases between pulses of a purge gas. The surface of the workpiece catalyzes the reaction between the precursor gases to form a thin, solid film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

Atomic Layer Deposition (ALD) is another thin film deposition technique. FIGS. 1A and 1B schematically illustrate the basic operation of ALD processes. Referring to FIG. 1A, a layer of gas molecules $A_x$ coats the surface of a workpiece W. The layer of $A_x$ molecules is formed by exposing the workpiece W to a precursor gas containing $A_x$ molecules, and then purging the chamber with a purge gas to remove excess $A_x$ molecules. This process can form $A_x$ a monolayer of molecules on the surface of the workpiece W because the $A_x$ molecules at the surface are held in place during the purge cycle by physical adsorption forces at moderate temperatures or chemisorption forces at higher temperatures. The layer of $A_x$ molecules is then exposed to another precursor gas containing $B_y$ molecules. The $A_x$ molecules react with the $B_y$ molecules to form an extremely thin layer of solid material on the workpiece W. The chamber is then purged again with a purge gas to remove excess $B_y$ molecules.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing, several cycles are repeated to build a thin film on a workpiece having the desired thickness. For example, each cycle may form a layer having a thickness of approximately 0.5–1.0 Å, and thus it takes many cycles to form a solid layer having a thickness of approximately 60 Å.

FIG. 3 schematically illustrates an ALD reactor 10 having a reaction chamber 20 coupled to a gas supply 30 and a vacuum 40. The reactor 10 also includes a heater 50 that supports the workpiece W and a gas dispenser 60 in the reaction chamber 20. The gas dispenser 60 includes a plenum 62 operatively coupled to the gas supply 30 and a distributor plate 70 having a plurality of holes 72. The plenum 62 is an open compartment through which the gases pass directly to the holes 72. In operation, the heater 50 heats the workpiece W to a desired temperature, and the gas supply 30 selectively injects the first precursor $A_x$, the purge gas, and the second precursor $B_y$ as described above for ALD or CVD processes. The vacuum 40 maintains a negative pressure in the chamber to draw the gases from the gas dispenser 60, across the workpiece W, and then through an outlet of the reaction chamber 20.

One concern of both the CVD and ALD processes is providing a consistent deposition rate, precise composition, and uniform thickness across the workpiece. These factors are influenced by the parameters of the individual gas flows of the constituent gases. For example, variances in the gas pressures, valve timing and response times can result in inconsistent volumes of precursor gases being dispensed from the gas dispenser. Conventional Pulsed-CVD processes and ALD processes attempt to provide consistent volumes of precursor gases by using more precise valves or mass flow controllers (i.e., flow meters). Although such devices are an improvement, they may not provide sufficiently accurate amounts of precursor gases to the workpiece.

Another concern associated primarily with ALD processing is that it has a relatively low throughput compared to CVD techniques. For example, ALD processing may take several seconds to perform each $A_x$-purge-$B_y$-purge. This results in a total process time of several minutes to form a single layer less than 100 Å thick. In contrast to ALD processing, CVD techniques require much less time to form a layer of the same thickness. The low throughput of existing ALD techniques limits the utility of the technology in its current state because ALD may be a bottleneck in the overall manufacturing process. Thus, it would be useful to increase the throughput of ALD techniques so that they could be used in a wider range of applications.

SUMMARY

The present invention is directed toward methods for depositing material onto workpieces, methods of controlling the delivery of gases in deposition processes, and apparatus for depositing materials onto workpieces. One embodiment of a method for depositing material onto a workpiece comprises placing a micro-device workpiece having a plurality of submicron features in a reactor proximate to outlet ports of a gas distributor in the reactor. This method also includes flowing a gas from a gas supply to a selectively sealable compartment of the reactor until the gas reaches a desired pressure within the compartment, and subsequently dispensing the gas from the outlet ports of the gas distributor. The compartment can be in a reaction chamber of the reactor or outside of the reaction chamber. The gas can be dispensed from the outlet ports by opening an outlet valve between the compartment and the outlet ports while also physically displacing the gas from the compartment. The gas can be displaced from the compartment using a piston, diaphragm, bladder or other type of mechanical actuator. In other embodiments, the gas is displaced from the compartment by driving another type of gas through the compartment while the outlet valve is open. As a result, a known volume or mass of the gas is actively displaced from the compartment by driving the gas out of the compartment with a driver that is separate from the gas itself.

Another embodiment of a method for depositing material onto a workpiece comprises placing a micro-device workpiece having a plurality of submicron features in a reactor proximate to outlet ports of a gas distributor and pressurizing a container of the reactor with a gas until the gas has a desired pressure while preventing the gas from flowing out of the outlet ports. For example, the container can be pressurized with the gas by flowing the gas into the container while an outlet valve of the container is closed. This embodiment of the method also includes actively displacing a volume of the gas from the container to flow the gas through the outlet portstoward the workpiece. The gas can be actively displaced from the container using a mechanical actuator or another gas as explained above.

Other aspects of the invention are directed toward methods of controlling the delivery of gases in processes for depositing material onto a micro-device workpiece. Several embodiments of these methods are practiced using a deposition system having a reactor including a reaction chamber; a gas distributor in the reaction chamber; and a gas supply to provide gas to the gas distributor. The gas distributor includes a plurality of outlet ports configured to dispense gas to the workpiece. One embodiment of a method for controlling the delivery of gases includes flowing a gas from the gas supply to a closed compartment of the chamber until the gas reaches a desired pressure within the compartment. This method further includes dispensing at least a portion of the gas from the outlet ports of the gas distributor by opening an outlet valve between the compartment and the outlet ports and displacing the gas from the compartment.

Another embodiment of a method for controlling the delivery of gases comprises pressurizing a container with a gas to a desired pressure; actively displacing a volume of the gas from the container by driving the gas with a driver separate from the gas; and dispensing the volume of gas from outlet ports of a gas distributor. The container can be pressurized by closing an outlet valve of the container and flowing the gas into the container until the gas reaches the desired pressure. The pressurized gas in the container can then be actively displaced from the container by opening the outlet valve and driving the gas out of the container with a mechanical actuator or another gas. Such mechanical actuators or other types of gases define a driver that is separate from the gas itself. For example, the gas used to pressurize the container can be a first precursor gas and/or a second precursor gas, and the driver that drives the gas from the container can be a purge gas.

The methods for depositing the material onto a workpiece and the methods for controlling the delivery of gases set forth above are particularly useful for Atomic Layer Deposition ("ALD") and Pulsed Chemical Vapor Deposition (Pulsed-CVD) processes. The container can accordingly be pressurized to a desired pressure with either a first precursor gas $A_x$, a second precursor gas $B_y$, and/or a combination of the first and second precursor gases $A_x$ and $B_y$.

Additional aspects of the invention are directed toward deposition systems or gas delivery systems for depositing a material onto a micro-device workpiece. In one embodiment, a deposition system for depositing a material onto a micro-device workpiece comprises a gas supply having at least a first gas and a reactor coupled to the gas supply. The reactor can include a reactor chamber, a workpiece holder in the chamber, and a gas distributor in the chamber proximate to the workpiece holder. The gas distributor can include a plurality of outlet ports positioned relative to the workpiece holder to direct gases to the workpiece. The reactor in this embodiment further comprises a gas container. The gas container can include a selectively sealable compartment, an inlet valve coupled to the gas supply, and an outlet valve in fluid communication with the outlet ports. In operation, the compartment of the gas container is closed to charge the compartment with a gas or otherwise seal the compartment. The compartment is opened by opening the outlet valve. When the outlet valve is open, the pressurized gas in the compartment is then actively displaced to force the gas from the compartment and through the outlet ports to deposit molecules of the gas onto the workpiece.

Another embodiment of a deposition system in accordance with the invention comprises a gas supply having a first gas, a second gas, and a purge gas. The deposition system of this embodiment further includes a reactor comprising a reaction chamber; a workpiece holder in the chamber; a gas distributor having a plurality of outlet ports positioned relative to the workpiece holder to direct gases to the workpiece holder; and a gas compartment having an inlet valve coupled to the gas supply and an outlet valve between the compartment and the outlet ports of the gas distributor. The deposition system further includes a control system having a computer including a computer readable medium containing instructions that (a) cause the compartment to be pressurized with at least one of the gases by opening the inlet valve and closing the outlet valve, and (b) cause a pulse of the gas to be dispensed through the outlet ports by opening at least the outlet valve.

DETAILED DESCRIPTION

The following disclosure describes several embodiments of systems for depositing materials onto micro-device workpieces, methods for depositing materials onto micro-device workpieces, and methods for controlling the delivery of gases in the deposition of materials onto micro-device workpieces. Many specific details of the invention are described below with reference to ALD and Pulsed-CVD deposition techniques that are used to deposit very thin layers on micro-device workpieces. The term "micro-device workpiece" is used throughout to include substrates upon which and/or in which microelectronic devices, micromechanical devices, data storage elements, read/write components, and other features are fabricated. For example, micro-device workpieces can be semiconductor wafers such as silicon or gallium arsenide wafers, glass substrates, insulative substrates, and many other types of materials. The micro-device workpieces typically have very small, submicron features, such as conductive lines, recesses or components that form integrated circuits. The term "gas" is used throughout to include any form of matter that has no fixed shape and will conform in volume to the space available, which specifically includes vapors (i.e., a gas having a temperature less than the critical temperature so that it may be liquified or solidified by compression at a constant temperature). Several embodiments in accordance with the invention are set forth in FIGS. 4-9 and the following text to provide a thorough understanding of particular embodiments of the invention. A person skilled in the art will understand, however, that the invention may have other embodiments that include more or less elements than those shown and described with reference to the embodiments of FIGS. 4-9.

A. Deposition Systems

Figure 1A:
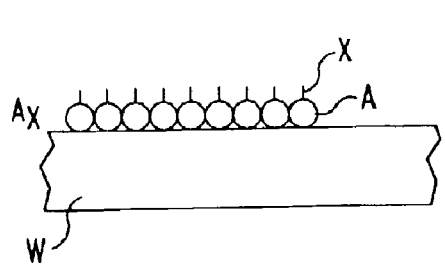
FIGS. 1A and 1B are schematic cross-sectional views of stages in ALD processing in accordance with the prior art.
Figure 1B:
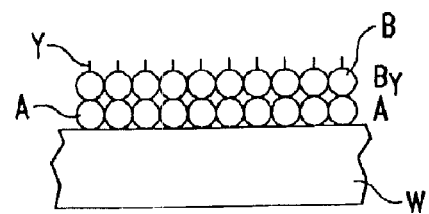
Figure 2:
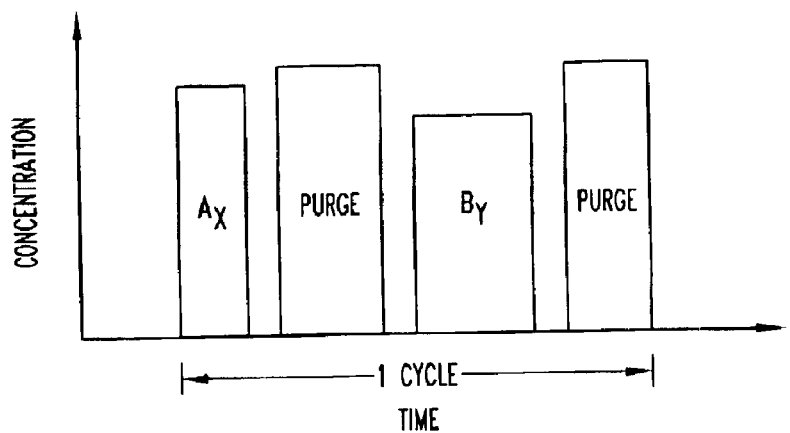
FIG. 2 is a graph illustrating a cycle for forming a layer using ALD techniques in accordance with the prior art.
Figure 3:
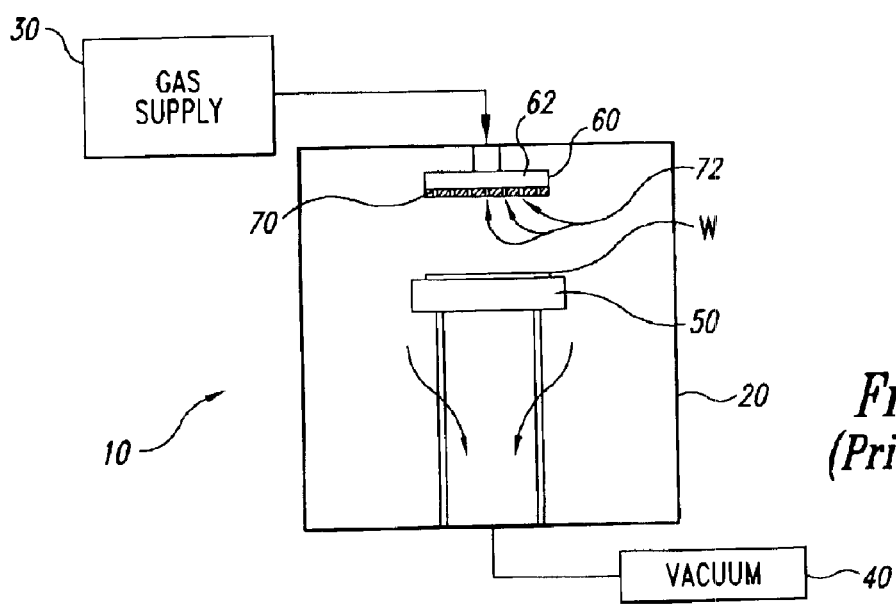
FIG. 3 is a schematic representation of a deposition system including a reactor for depositing a material onto a microelectronic workpiece in accordance with the prior art.
Figure 4:
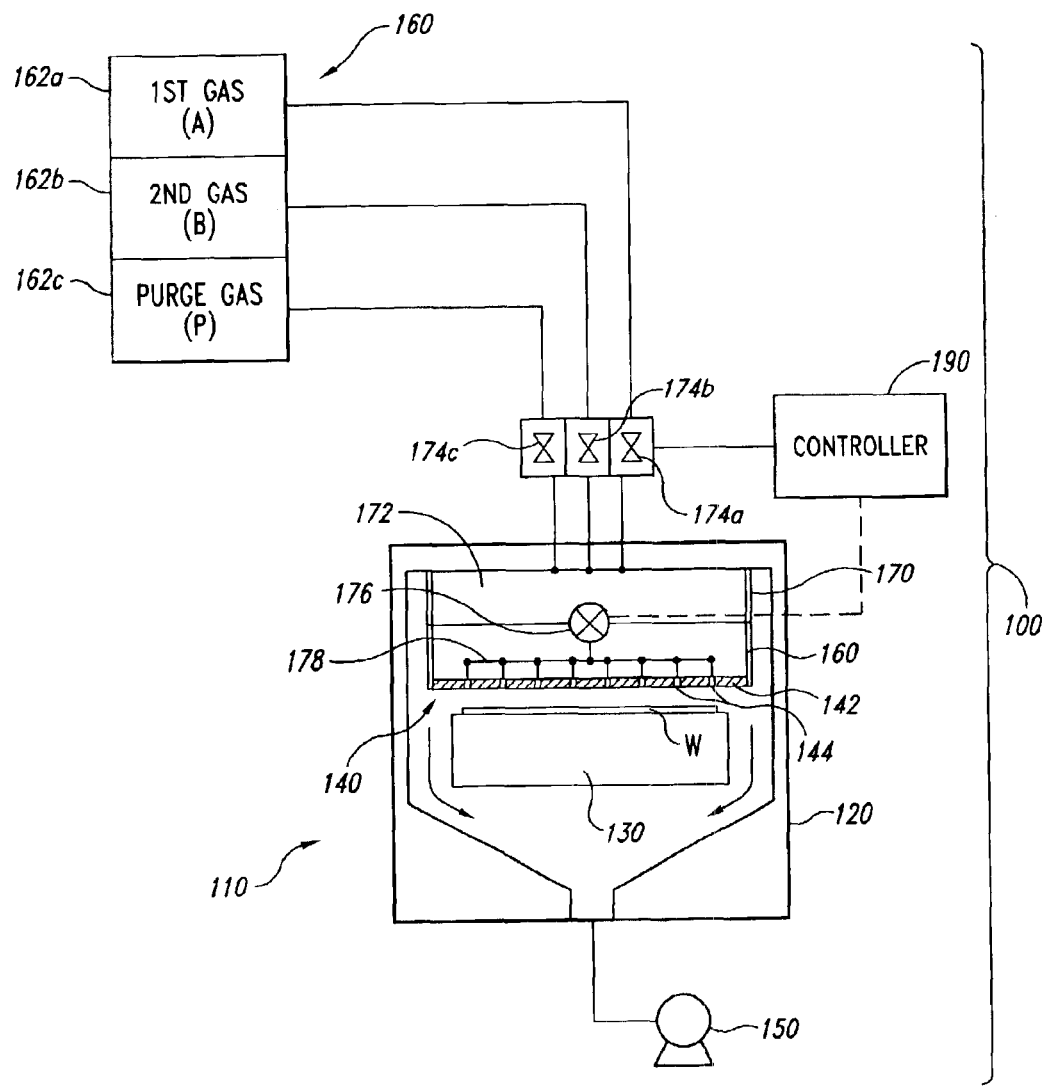
FIG. 4 is a schematic side view of a deposition system for depositing material onto a micro-device workpiece in accordance with one embodiment of the invention.

FIG. 4 is a schematic side view of a deposition system 100 for depositing materials onto a micro-device workpiece W in accordance with one embodiment of the invention. In this embodiment, the system 100 includes a reactor 110 having a reaction chamber 120, a workpiece support 130 in the chamber 120, and a gas distributor 140 in the chamber 120. The workpiece holder 130 can be a heater or heat sink that holds the workpiece at a desired temperature. The gas distributor 140 is positioned over the workpiece holder 130 to deliver gas(es) to the workpiece. In the embodiment shown in FIG. 4, the reaction chamber 120 is coupled to a vacuum 150 to draw gas(es) across the workpiece W and out of the reaction chamber 120. More specifically, the gas distributor 140 can include a distributor plate 142 having a plurality of outlet ports 144 through which the gas(es) flow to the workpiece W.

The system 100 can further include a gas supply assembly 160 that provides one or more gases to the reactor 110. The gas supply assembly 160, for example, can include a first gas source 162a, a second gas source 162b, and a third gas source 162c. The first gas source 162a can provide a first precursor gas A, the second gas source 162b can provide a second precursor gas B, and the third gas source 162c can provide a purge gas P. It will be appreciated that the gas supply assembly 160 can have other embodiments that provide more precursor gases and/or more purge gases. The specific gas sources in the gas supply assembly 160 accordingly depend upon the specific application and materials that are deposited onto the workpiece W.

The system 100 further includes a gas control system for dispensing an accurate mass of each type of gas to the workpiece W. The gas control system can include a gas container 170 that is a component of the reactor 110. The gas container 170, for example, can be in the reaction chamber 120 (as shown in FIG. 4), or the gas container 170 can be outside of the reaction chamber 120 in other embodiments. The gas container 170, more specifically, can be in the gas distributor 140 or just upstream from the gas distributor. The gas container 170 can include one or more compartments 172, at least one inlet valve 174 (identified individually by reference numbers 174a–c), and at least one outlet valve 176. The inlet valves 174a–c can be coupled to corresponding gas sources 162a–c. The outlet valve 176 can be coupled to the outlet ports 144 by a system of dedicated gas lines 178. It will be appreciated that the gas lines 178 are not necessary, and that a separate plenum between the distributor plate 142 and the outlet valve 176 can be used to provide fluid communication between the outlet valve 176 and the outlet ports 144.

The inlet valves 174a–c and the outlet valve 176 are controlled by a controller 190 to form layers of materials on the workpiece W using either ALD, CVD, or Pulsed-CVD processing techniques. As explained in more detail below, the outlet valve 172 is closed to charge or otherwise pressurize the compartment 172 of the gas container 170 with a gas. The pressure of the gas in the closed compartment 172 can be adjusted to provide the desired mass of a precursor gas for ALD or Pulsed-CVD processes. Once the pressure in the compartment reaches a desired level, the outlet valve 176 can be opened and the gas in the compartment 172 can be actively displaced or discharged from the compartment 172. The embodiments of the gas control systems shown in FIGS. 4–9 are expected to provide accurate control of the quantity of gas molecules dispensed to the workpiece W to enhance the control of the deposition rate, composition, and uniformity of the deposited layer.

B. Gas Control Systems

Figure 5:
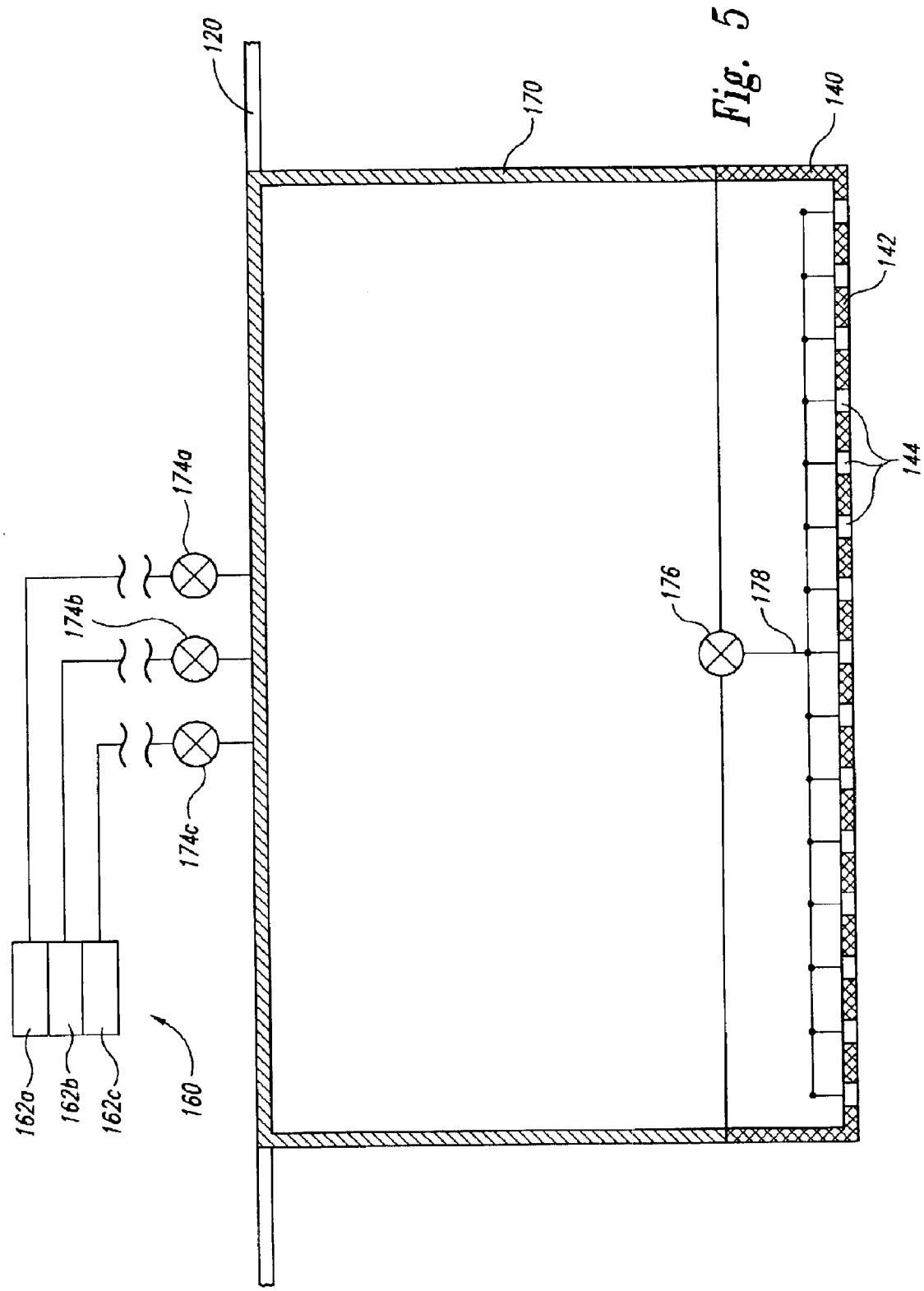
FIG. 5 is a schematic cross-sectional view of a gas distributor and a gas container in accordance with an embodiment of the invention.

FIG. 5 is a schematic cross-sectional view of the gas distributor 140 and the container 170 of the embodiment shown in FIG. 4. One method for controlling the delivery of gases in processes for depositing material onto a micro-device workpiece includes flowing a gas from the gas supply 160 to the compartment 172 until the gas reaches a desired pressure within the compartment. The compartment 172 can be closed (i.e., selectively sealed) during this stage by closing the outlet valve 176, and the incoming gas can pass through either the first inlet valve 174a, the second inlet valve 174b, and/or the third inlet valve 174c. Because the outlet valve 176 is closed and the volume of the compartment 172 is fixed, the pressure in the compartment corresponds to a known quantity of gas molecules for each type of gas at a known temperature. Once the gas in the compartment 172 reaches a desired pressure range corresponding to the mass of gas for a gas pulse, the outlet valve 176 is opened while the gas in the compartment 172 is displaced or otherwise driven from the compartment 172. The gas in the compartment 172 accordingly flows through the gas lines 178 and out through the outlet ports 144 to be deposited on a workpiece (not shown in FIG. 5). In the embodiment shown in FIG. 5, the driver that displaces the pressurized gas from the compartment 172 is another gas different than the pressurized gas.

One embodiment for operating the gas control system shown in FIG. 5 is directed toward ALD processing techniques. In this embodiment, the compartment 172 is pressurized with the first precursor gas A by closing the outlet valve 176 and opening the first inlet valve 174a to flow the first precursor gas A into the compartment 172. Once a desired mass of the first precursor gas A is in the compartment 172, then the first inlet valve 174a is closed; the third inlet valve 174c is opened; and the outlet valve 176 is also opened. The purge gas P accordingly flows into the compartment 172 to drive the pressurized first precursor gas A through the outlet valve 176, the gas lines 178, and the outlet ports 144. The purge gas P can continue flowing through the compartment 172 while the outlet valve 176 is open to provide a purge cycle. To terminate the purge cycle, the third inlet valve 174c is closed and the second inlet valve 174b is opened. The outlet valve 176 can remain open for a short period of time after opening the second inlet value 174b to flush the purge gas P from the compartment 172 with the second precursor B. Once the purge gas P is flushed from the compartment 172 by the second precursor B, the second outlet valve 176 is closed while the flow of the second precursor B continues to pressurize the compartment 172 with the second precursor B. After a desired mass of the second precursor B is in the compartment 172, the second inlet valve 174b is closed, the third inlet valve 174c is opened, and the outlet valve 176 is also opened. The purge gas P accordingly drives the second precursor B from the compartment 172 to flow the second precursor B out through the outlet ports 144. This cycle is repeated to deposit the first precursor A, purge excess molecules of the first precursor A, deposit the second precursor B, and then purge the excess molecules of the second precursor B to form a thin layer of material on the workpiece.

The gas control system shown in FIG. 5 can also be used in Pulsed-CVD processing techniques. In one embodiment, the compartment 172 is pressurized with both the first and second precursors A and B at the same time by opening the first and second inlet valves 174a and 174b while the outlet valve 176 is closed. After the pressure in the compartment 172 reaches a desired level, the first and second inlet valves 174a and 174b are closed, the third inlet valve 174c is opened, and the outlet valve 176 is also opened to drive the mixture of the first and second precursors A and B from the compartment 172. This cycle is repeated until a layer of material is deposited onto the workpiece.

In either the ALD or the Pulsed-CVD applications, one embodiment of a method for controlling the delivery of gases comprises pressurizing a container with a gas to a desired pressure; actively displacing a volume of the gas from the container by driving the gas with a driver separate from the gas; and dispensing the volume of gas from the outlet ports of the gas distributor. Another embodiment of a method for controlling the delivery of gases comprises filling a container of a reactor with a desired mass of a precursor gas for a pulse of the precursor gas; actively displacing the precursor gas from the container by driving the precursor gas with a driver separate from the precursor gas; and dispensing the mass of the precursor gas from the outlet ports of a gas distributor in the reactor. The driver can be a gas or fluid that is separate from the particular precursor gas(es) in the compartment. As explained in more detail below, the driver can alternatively be a mechanical actuator.

Figure 6:
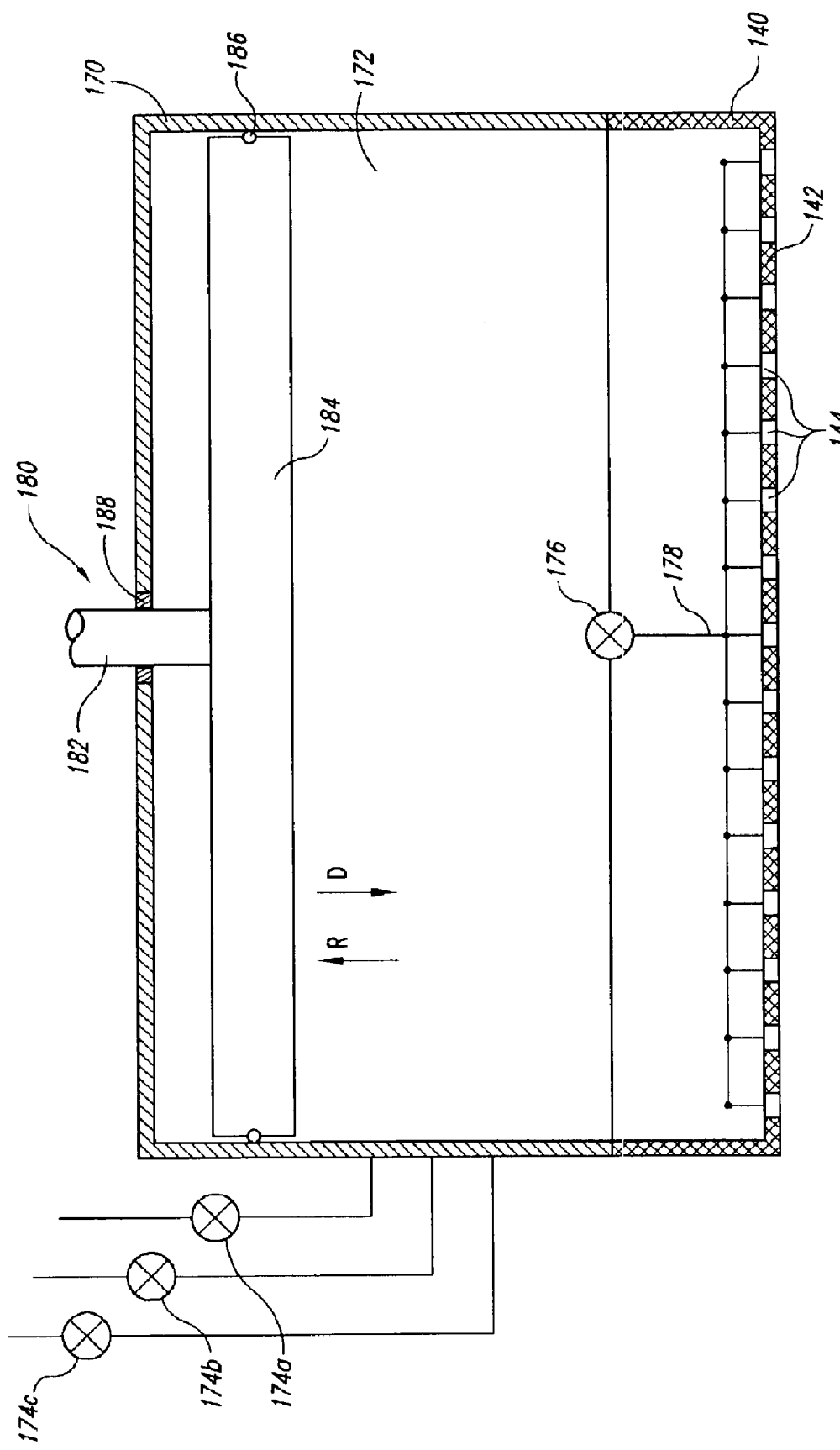
FIG. 6 is a cross-sectional view of a gas distributor and a gas container in accordance with another embodiment of the invention.

FIG. 6 is a schematic cross-sectional view of a gas distributor 140 and a container 170 in accordance with another embodiment of the invention. In this embodiment, the gas control system further includes a mechanical driver 180 in the container 170. The mechanical driver 180 can be a piston assembly having a drive shaft 182, a head 184 at one end of the drive shaft 182, and a ring 186 around the head 184. The drive shaft 182 can be sealed to the container 170 by a seal 188. The mechanical actuator 180 can move between a first or retracted position (arrow R) and a second or discharge position (arrow D).

In operation, a method of controlling the delivery of gases in deposition processes comprises pressurizing the container 170 with the first precursor A and/or the second precursor B. For example, the container 170 can be pressurized by flowing the first precursor A from the gas supply to the compartment 172 when the outlet valve 176 is closed and the mechanical actuator 180 is in a retracted position. The flow of the first precursor A is terminated when the pressure of the first precursor A reaches a desired pressure within the closed compartment 172. The first precursor A is then dispensed from the outlet ports 144 by opening the outlet valve 176 and displacing the first precursor gas from the compartment 172. The first precursor A is displaced from the compartment 172 by driving the piston head 184 toward the distributor plate 142 from the first position to the second position. After a sufficient mass of the first precursor is displaced from the compartment 172, the first inlet valve 174a is closed and the third inlet valve 174c is opened to purge the compartment 172 with a purge gas P. The mechanical actuator 180 can be retracted to the first position during the purge cycle (arrow R). After the purge cycle, the compartment 172 is pressurized with the second precursor B by closing the outlet valve 176 and opening the second inlet valve 174b. The flow of the second precursor B continues until the pressure in the container 170 reaches a desired pressure. The outlet valve 176 is then opened and the mechanical actuator 180 is moved from the first position to the second position to drive the volume of the second precursor B out through the outlet ports 144. The third inlet valve 174c is opened after the mechanical actuator 180 returns to the retracted position to provide a purge cycle. These cycles are then repeated to perform an ALD process using a mechanical actuator.

The embodiment of the gas control system shown in FIG. 6 can also be used to perform Pulsed-CVD processing techniques. It will be appreciated that Pulsed-CVD techniques can be implemented by pressurizing the chamber with both the first precursor A and the second precursor B by opening the first and second inlet valves 174a and 174b until the pressure reaches a desired level. The first and second inlet valves 174a and 174b are then closed, the outlet valve 176 is opened, and the mechanical actuator 180 is moved downwardly toward the distributor plate 142 to dispense the first and second precursors from the outlet ports 144. A purge gas can be passed through the compartment 172 to the workpiece in a manner similar to the ALD processing technique explained above.

Figure 7:
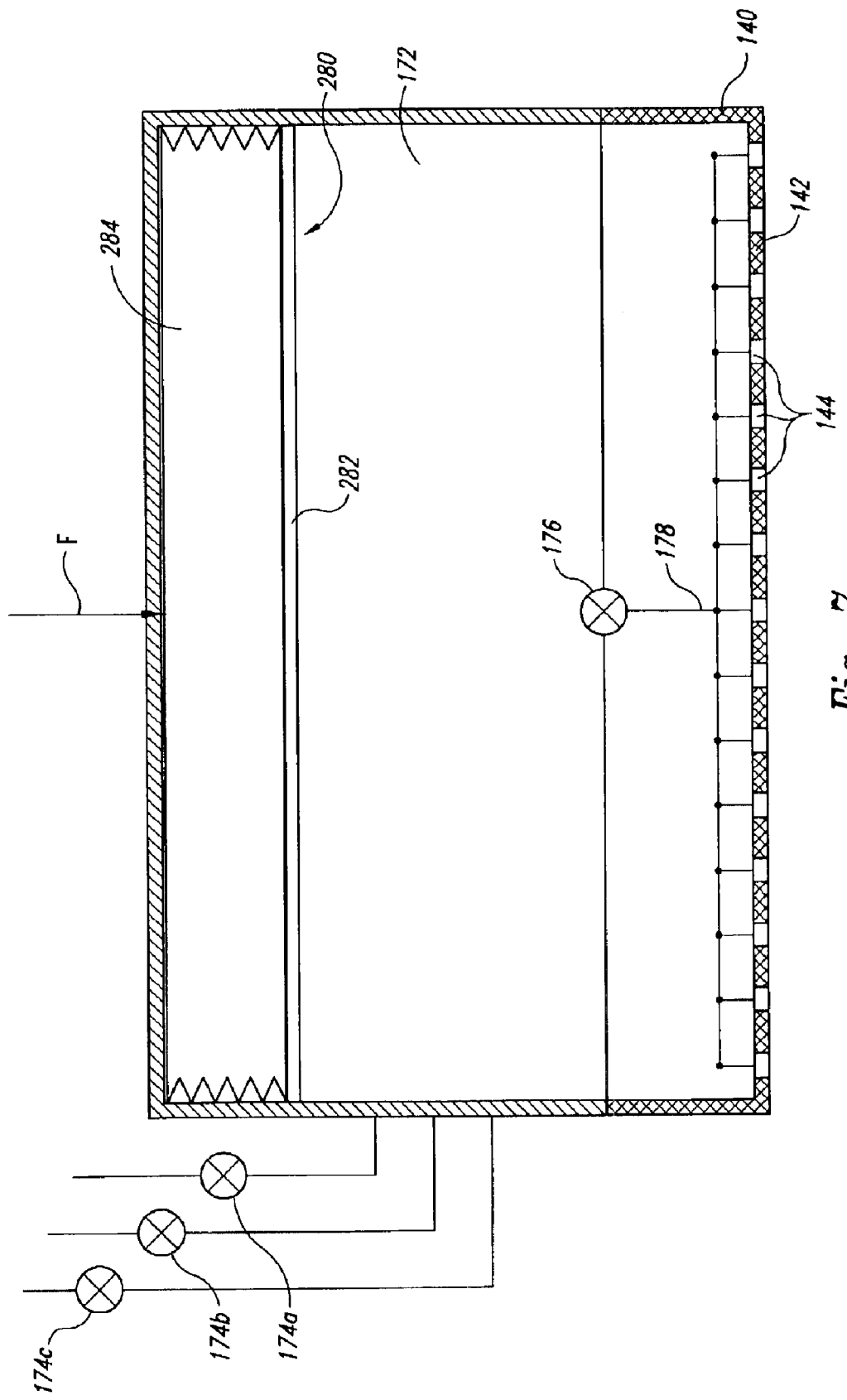
FIG. 7 is a cross-sectional view of a gas distributor and a gas container in accordance with still another embodiment of the invention.

FIG. 7 is a schematic cross-sectional view of another gas assembly that includes a mechanical actuator 280 in accordance with another embodiment of the invention. In this embodiment, the mechanical actuator 280 is a diaphragm 282 having a cavity 284 that can be filled with a drive fluid F. In operation, the drive fluid F flows into the cavity 284 to expand the diaphragm 282 and drive the particular gas from the compartment 272. The embodiment of the gas control system shown in FIG. 7 is expected to operate in a manner similar to that described above with respect to FIG. 6.

Figure 8:
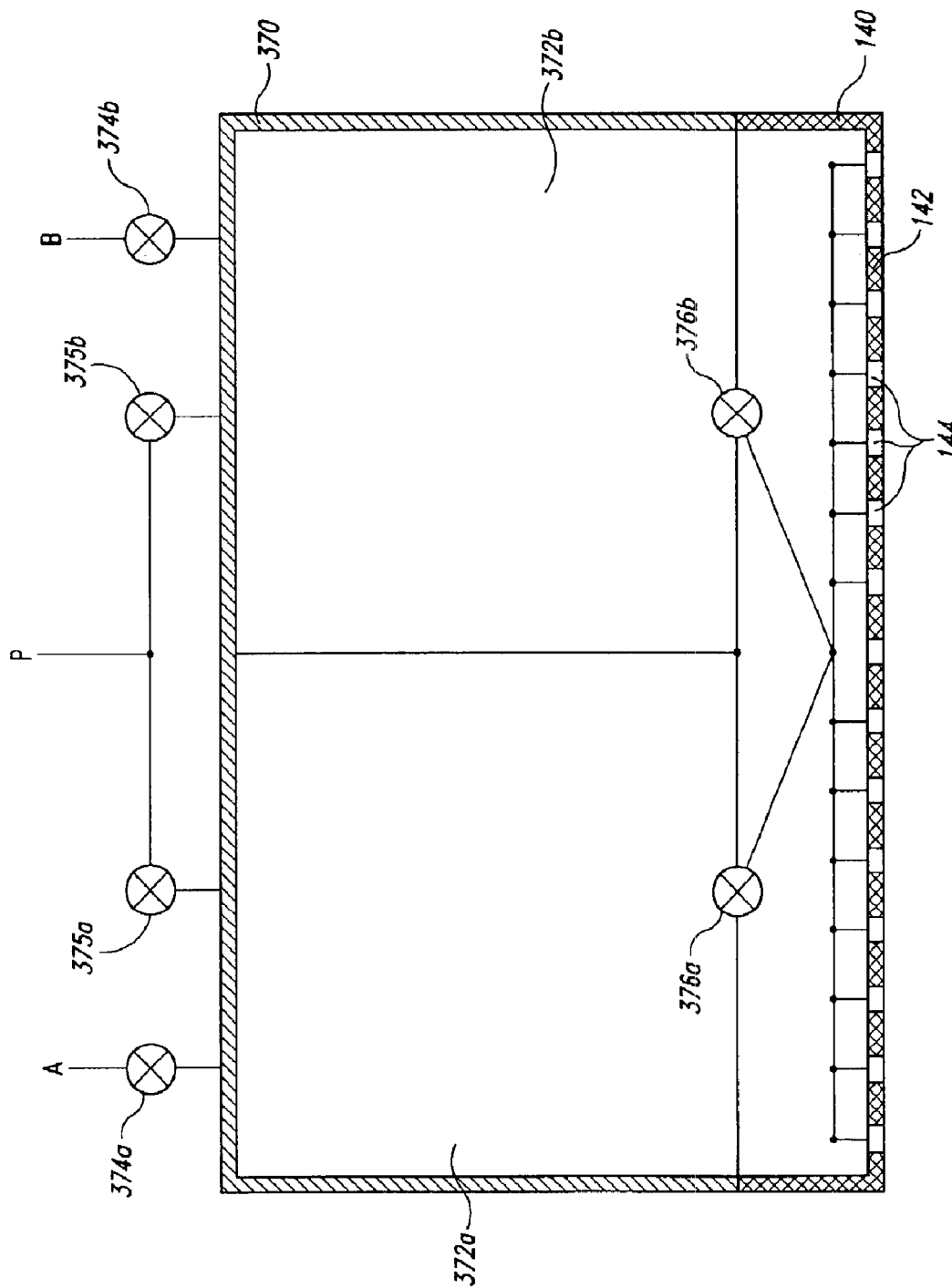
FIG. 8 is a cross-sectional view of a gas distributor and a gas container in accordance with yet another embodiment of the invention.

FIG. 8 is a cross-sectional view of another embodiment of a gas supply system having a container 370 that includes a first compartment 372a and a second compartment 372b. The container 370 can be a component of the gas distributor 140, or the container 370 can be a separate component upstream from the gas distributor 140. The first container 372a can include a first inlet valve 374a coupled to the source of the first precursor gas A, a second inlet valve 375a coupled to the source of the purge gas P, and a first outlet valve 376a. The second compartment 372b can include a first inlet valve 374b coupled to the source of the second precursor B, a second inlet valve 375b coupled to the source of the purge gas P, and a second outlet valve 376b. The first and second outlet valves 376a and 376b are coupled to the outlet ports 144 of the gas distributor 140 via gas lines 378 or another type of passageway, such as a plenum. The embodiment of the container 370 shown in FIG. 8 can be operated by independently charging and discharging gases from the first and second compartments 372a and 372b to perform ALD or CVD processes.

In one embodiment for ALD processing, the gas control system shown in FIG. 8 is operated by charging the first compartment 372a with the first precursor A and charging the second compartment 372b with the second precursor B. The first and second compartments 372a and 372b can be charged independently from each other to enhance the flexibility and throughput of ALD and Pulsed-CVD processes. The first compartment 372a is pressurized by closing the first outlet valve 376a and opening the first inlet valve 374a. Similarly, the second compartment 372b is charged independently by closing the second outlet valve 376b and opening the second inlet valve 374b. Once the first and second compartments are initially charged, the first precursor A is discharged from the first compartment 372a by opening the first outlet valve 376a and opening the second inlet valve 375a of the first compartment 372a. The purge gas P accordingly flows through the second inlet valve 375a of the first compartment 372a to drive the first precursor A through the first outlet valve 376a and out through the outlet ports 144. After the pulse of the first precursor A, the purge gas P continues to flow from the first outlet valve 176a to purge excess molecules of the first precursor A from the workpiece. After the purge cycle, the first outlet valve 176a is closed and the first compartment 372a is recharged with the first precursor A by opening the first inlet valve 374a of the first compartment 372a. While the first compartment 372a is being recharged with the first precursor A, a pulse of the second precursor B is contemporaneously applied to the workpiece by opening the second outlet valve 376b and the second inlet valve 375b of the second compartment 372b. The second precursor B in the second compartment 372b accordingly flows through the gas lines 378 and out of the outlet ports 144 to the workpiece while the first compartment is being recharged with the first precursor. The purge gas P continues to flow through the second inlet valve 375b of the second compartment 372b to purge excess molecules of the second precursor B from the workpiece. After this purge cycle is complete, the second outlet valve 176b is closed and the second compartment 372b is recharged with the second precursor B. By the time the purge cycle of the second precursor B is complete, the first compartment 372a has been recharged with the first precursor A. The first outlet valve 376a can be opened and the second outlet valve 376b can be closed to discharge the first precursor A from the first compartment 372a while the second compartment 372b is recharged with the second precursor B. This procedure can be repeated several times to continuously charge and recharge the first and second compartments 372a and 372b with the precursors.

Figure 9:
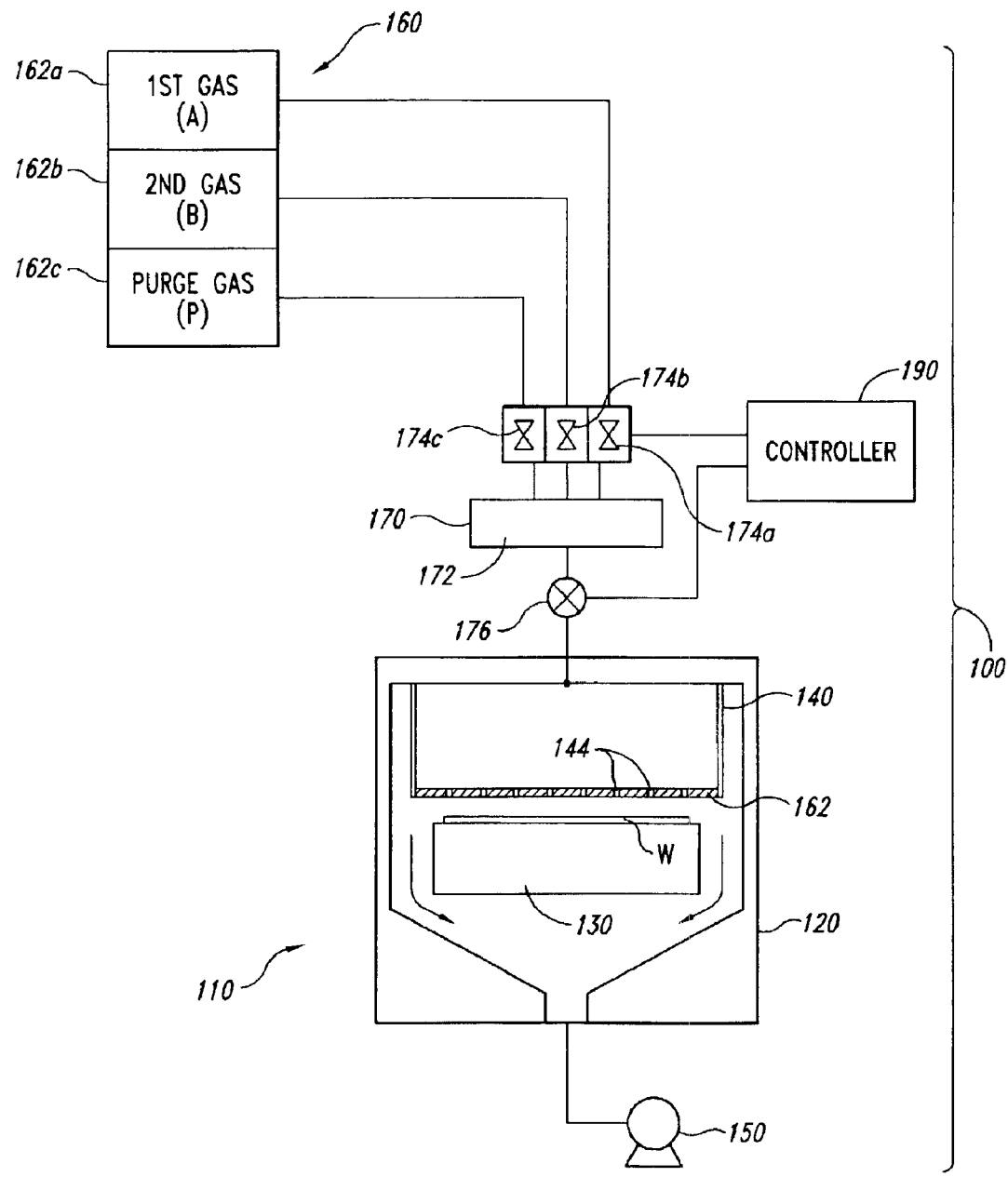
FIG. 9 is a schematic side view of another deposition system for depositing material onto a micro-device workpiece in accordance with another embodiment of the invention.

FIG. 9 is a schematic side view of another embodiment of a system 900 in accordance with the invention. Like reference numbers refer to like components in FIGS. 4 and 9. In this embodiment, the container 170 is outside of the reaction chamber 120 but is considered a component of the reactor 110. The container 170 accordingly does not need to be within the reaction chamber 120, but rather is downstream from the gas sources and upstream from the distributor plate 142. The system 900 is expected to operate in a manner similar to any of the systems explained above with reference to FIGS. 4–8.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of controlling the delivery of gases in a pulse-type reactor for depositing material onto a microdevice workpiece, comprising:

filling a container of the reactor with a desired mass of a precursor gas for a pulse of the precursor gas;

actively displacing the precursor gas from the container by driving the precursor gas with a driver separate from the precursor gas; and dispensing the mass of the precursor gas from outlet ports of a gas distributor in the reactor, wherein the container comprises a compartment, a first inlet valve coupled to a first gas supply, a second inlet valve coupled to a second gas supply, and an outlet valve coupled to the outlet ports of the gas distributor;

filling the container comprises opening the first inlet valve to flow a first precursor into the compartment until a pressure of the first precursor in the compartment reaches a desired pressure corresponding to the desired mass of single pulse of the first precursor; and actively displacing the precursor gas from the outlet ports comprises closing the first inlet valve, opening the outlet valve, and opening the second inlet valve to flow a purge gas into the compartment that drives the first gas out of the compartment.

2. A method of controlling the delivery of gases in a pulse-type reactor for depositing material onto a microdevice workpiece, comprising:

filling a container of the reactor with a desired mass of a precursor gas for a pulse of the precursor gas;

actively displacing the precursor gas from the container by driving the precursor gas with a driver separate from the precursor gas; and dispensing the mass of the precursor gas from outlet ports of a gas distributor in the reactor, wherein the container comprises a compartment, a first inlet valve coupled to a first gas supply, an outlet valve coupled to the outlet ports of the gas distributor, and a mechanical driver in the compartment that moves between a first position defining a first volume in the compartment and a second position defining a second volume in the compartment less than the first volume;

filling the container comprises opening the first inlet valve to flow a first precursor gas into the compartment until a pressure of the first precursor gas in the compartment reaches a desired pressure corresponding to the desired mass of a single pulse of the first precursor gas; and actively displacing the precursor gas from the outlet ports comprises closing the first inlet valve, opening the outlet valve, and moving the mechanical actuator from the first position to the second position.

3. A method of controlling the delivery of gases in a pulse-type reactor for depositing material onto a microdevice workpiece, comprising:

filling a container of the reactor with a desired mass of a precursor gas for a pulse of the precursor gas;

actively displacing the precursor gas from the container by driving the precursor gas with a driver separate from the precursor gas; and dispensing the mass of the precursor gas from outlet ports of a gas distributor in the reactor, wherein the container comprises a compartment within the gas distributor, a first inlet valve coupled to a first gas supply, a second inlet valve coupled to a second gas supply, an outlet valve coupled to the outlet ports of the gas distributor, and a mechanical driver in the compartment that moves between a first position defining a first volume in the compartment and a second position defining a second volume in the compartment less than the first volume;

filling the container comprises opening the first inlet valve to flow a first precursor gas into the compartment until a pressure of the first precursor gas in the compartment reaches a desired pressure;

actively displacing the precursor gas from the outlet ports comprises closing the first inlet valve, opening the outlet valve, and moving the mechanical actuator from the first position to the second position;

the method further comprises pressurizing the compartment by opening the second valve to flow a second precursor gas into the compartment until a pressure of the second precursor gas in the compartment reaches a desired pressure; and the method further comprises actively displacing the second precursor gas by closing the second inlet valve, opening the outlet valve, and moving the mechanical actuator from the first position to the second position.

4. A method of controlling the delivery of gases in a pulse-type reactor for depositing material onto a microdevice workpiece, comprising:

filling a container of the reactor with a desired mass of a precursor gas for a pulse of the precursor gas;

actively displacing the precursor gas from the container by driving the precursor gas with a driver separate from the precursor gas; and dispensing the mass of the precursor gas from outlet ports of a gas distributor in the reactor, wherein filling a container with gas comprises charging a compartment with a first precursor gas to a first pressure; and actively displacing precursor gas from the container, comprises moving a mechanical actuator within the compartment from a first position defining a first volume to a second position defining a second volume less than the first volume.

5. The method of claim 4 wherein the mechanical actuator comprises a piston, and moving the mechanical actuator comprises moving the piston from the first position to the second position.

6. The method of claim 4 wherein the mechanical actuator comprises a diaphragm, and moving the mechanical actuator comprises moving the diaphragm from the first position to the second position.

7. A method of controlling the delivery of gases in a pulse-type reactor for depositing material onto a microdevice workpiece, comprising:

filling a container of the reactor with a desired mass of a precursor gas for a pulse of the precursor gas;

actively displacing the precursor gas from the container by driving the precursor gas with a driver separate from the precursor gas; and dispensing the mass of the precursor gas from outlet ports of a gas distributor in the reactor, wherein the container comprises a compartment, a first inlet valve coupled to a first gas supply of a first precursor, a second inlet valve coupled to a second gas supply of a second precursor, and a third inlet valve coupled to a purge gas, and an outlet valve coupled to the outlet ports of the gas distributor;

filling the container comprises charging the compartment with the first precursor to a desired pressure by opening the first inlet valve while the second inlet valve, the third inlet valve, and the outlet valve are closed;

displacing the precursor gas from the outlet ports comprises discharging the first precursor from the compartment by opening the outlet valve and the third inlet valve while first inlet valve and the second inlet valve are dosed to flow the purge gas through the compartment in a manner that drives the first precursor out of the gas dispenser;

filling the container further comprises charging the compartment with the second precursor to a desired pressure by opening the second inlet valve while the first inlet valve, the third inlet valve, and the outlet valve are closed; and displacing the precursor gas further comprises discharging the second precursor from the compartment by opening the outlet valve and the third inlet valve while the first inlet valve and the second inlet valve are closed to flow the purge gas through the compartment in a manner that drives the second precursor out of the gas dispenser.

8. A method of controlling the delivery of gases in a pulse-type reactor for depositing material onto a microdevice workpiece, comprising:

filling a container of the reactor with a desired mass of a precursor gas for a pulse of the precursor gas;

actively displacing the precursor gas from the container by driving the precursor gas with a driver separate from the precursor gas; and dispensing the mass of the precursor gas from outlet ports of a gas distributor in the reactor, wherein the container comprises a compartment, a first inlet valve coupled to a first gas supply of a first precursor, a second inlet valve coupled to a second gas supply of a second precursor, a third inlet valve coupled to a purge gas, and an outlet valve coupled to the outlet ports of the gas distributor;

filling the container comprises charging the compartment with the first and second precursors to a desired pressure by opening the first and second inlet valves while the third inlet valve and the outlet valve are closed; and displacing the precursor gas from the outlet ports comprises discharging the first and second precursors from the compartment by opening the outlet valve and the third inlet valve while first inlet valve and the second inlet valve are closed to flow the purge gas through the compartment in a manner that drives the first and second precursors out of the gas dispenser.

9. A method of controlling the delivery of gases in processes for depositing material onto a micro-device workpiece using a deposition system having a reactor comprising a chamber including a gas distributor with a plurality of outlet ports configured to dispense gas to the workpiece and a gas supply to provide gas to the vacuum chamber, the method comprising:

flowing a gas from the gas supply to a selectively sealable compartment of the reactor until the gas reaches a pressure within the compartment corresponding to a desired mass for a pulse of the gas; and dispensing at least a portion of the gas from the outlet ports of the gas distributor by opening a valve between the compartment and the outlet ports and displacing the gas from the compartment.

10. The method of claim 9 wherein:

the reactor further comprises a first inlet valve coupled to a first gas supply and the compartment, a second inlet valve coupled to a second gas supply and the compartment, and an outlet valve coupled to the outlet ports of the gas distributor and the compartment;

flowing the gas comprises pressurizing the compartment by opening the first inlet valve to flow a first precursor into the compartment until a pressure of the first precursor in the compartment reaches a desired pressure corresponding to the desired mass of a single pulse of the first precursor; and dispensing the gas comprises closing the first inlet valve, opening the outlet valve, and opening the second inlet valve to flow a purge gas into the compartment that drives the first gas out of the compartment.

11. The method of claim 9 wherein:

the reactor further comprises a first inlet valve coupled to a first gas supply and the compartment, an outlet valve coupled to the outlet ports of the gas distributor and the compartment, and a mechanical driver in the compartment that moves between a first position defining a first volume in the compartment and a second position defining a second volume in the compartment less than the first volume;

flowing the gas comprises pressurizing the compartment by opening the first inlet valve to flow a first precursor gas into the compartment until a pressure of the first precursor gas in the compartment reaches a desired pressure corresponding to the desired mass of a single pulse of the first precursor gas; and dispensing the gas comprises closing the first inlet valve, opening the outlet valve, and moving the mechanical actuator from the first position to the second position.

12. The method of claim 9 wherein:

the reactor further comprises a first inlet valve coupled to a first gas supply and the compartment, an outlet valve coupled to the outlet ports of the gas distributor and the compartment, and a mechanical driver in the compartment that moves between a first position defining a first volume in the compartment and a second position defining a second volume in the compartment less than the first volume;

flowing the gas comprises pressurizing the compartment by opening the first inlet valve to flow a first precursor gas into the compartment until a pressure of the first precursor gas in the compartment reaches a desired pressure;

dispensing the gas comprises closing the first inlet valve, opening the outlet valve, and moving the mechanical actuator from the first position to the second position;

the method further comprises pressurizing the compartment by opening the second valve to flow a second precursor gas into the compartment until a pressure of the second precursor gas in the compartment reaches a desired pressure; and the method further comprises dispensing the second precursor gas by closing the second inlet valve, opening the outlet valve, and moving the mechanical actuator from the first position to the second, position.

13. The method of claim 9 wherein:

flowing the gas comprises charging a compartment with a first precursor gas to a first pressure; and dispensing the gas from the container comprises moving a mechanical actuator within the compartment from a first position defining a first volume to a second position defining a second volume less that the first volume.

14. The method of claim 9 wherein:

the reactor further comprises a first inlet valve coupled to a first gas supply of a first precursor and the compartment, a second inlet valve coupled to a second gas supply of a second precursor and the compartment, and a third inlet valve coupled to a purge gas and the compartment, and an outlet valve coupled to the outlet ports of the gas distributor and the compartment;

flowing the gas comprises pressurizing the compartment with the first precursor to a desired pressure by opening the first inlet valve while the second inlet valve, the third inlet valve, and the outlet valve are closed:

dispensing the gas from the outlet ports comprises discharging the first precursor from the compartment by opening the outlet valve and the third inlet valve while first inlet valve and the second inlet valve are closed to flow the purge gas through the compartment in a manner that drives the first precursor out of the gas dispenser;

flowing the gas further comprises pressurizing the compartment with the second precursor to a desired pressure by opening the second inlet valve while the first inlet valve, the third inlet valve, and the outlet valve are closed; and dispensing the gas further comprises discharging the second precursor from the compartment by opening the outlet valve and the third inlet valve while the first inlet valve and the second inlet valve are closed to flow the& purge gas through the compartment in a manner that drives the second precursor out of the gas dispenser.

15. The method of claim 9 wherein:

the reactor further comprises a first inlet valve coupled to a first gas supply of a first precursor and the compartment, a second inlet valve coupled to a second gas supply of a second precursor and the compartment, a third inlet valve coupled to a purge gas and the compartment, and an outlet valve coupled to the outlet ports of the gas distributor and the compartment;

flowing the gas comprises pressurizing the compartment with the first and second precursors to a desired pressure by opening the first and second inlet valves while the third inlet valve and the outlet valve are closed; and dispensing the gas from the outlet ports comprises discharging the first and second precursors from the compartment by opening the outlet valve and the third inlet valve while first inlet valve and the second inlet valve are closed to flow the purge gas through the compartment in a manner that drives the first and second precursors out of the gas dispenser.

16. The method of claim 9 wherein:

the reactor comprises a first compartment and second compartment, the first compartment being coupled to a supply of a first precursor gas, and the second compartment being coupled to a supply of a second precursor gas;

flowing the gas comprises charging the first compartment with the first precursor gas and charging the second compartment with the second precursor gas;

dispensing the precursor gas comprises (a) driving the first precursor gas from the first compartment using a purge gas and then (b) driving the second precursor gas from the second compartment using a purge gas; and flowing the gas further comprises recharging the first compartment with the first precursor while driving the second precursor from the second compartment and recharging the second compartment while driving the first precursor from the first compartment.

17. A method of controlling the delivery of gases in processes for depositing material onto a micro-device workpiece using a reactor comprising a chamber including a gas distributor with outlet ports configured to dispense gas to the workpiece, the method comprising:

pressuring a first compartment of the chamber with a first gas while prohibiting the first gas from flowing from the first compartment through the outlet ports;

opening a fluid passageway between the first compartment and the outlet ports after the first gas reaches a desired pressure in the first compartment; and driving the first gas from the first compartment and through the outlet ports, wherein the reactor further comprises a first inlet valve coupled to a first gas supply and the first compartment, a second inlet valve coupled to a second gas supply and the first compartment, and an outlet valve coupled to the outlet ports of the gas distributor and the first compartment;

pressurizing the first compartment comprises opening the first inlet valve to flow a first precursor into the first compartment until a pressure of the first precursor in the first compartment reaches a desired pressure corresponding to the desired mass of a single pulse of the first precursor; and driving the gas from the first compartment comprises closing the first inlet valve, opening the outlet valve, and opening the second inlet valve to flow a purge gas into the first compartment that drives the first gas out of the first compartment.

18. A method of controlling the delivery of gases in processes for depositing material onto a micro-device workpiece using a reactor comprising a chamber including a gas distributor with outlet ports configured to dispense gas to the workpiece, the method comprising:

pressurizing a first compartment of the chamber with a first gas while prohibiting the first gas from flowing from the first compartment through the outlet ports;

opening a fluid passageway between the first compartment and the outlet ports after the first gas reaches a desired pressure in the first compartment; and driving the first gas from the first compartment and through the outlet ports, wherein the reactor further comprises a first inlet valve coupled to a first gas supply and the first compartment, an outlet valve coupled to the outlet ports of the gas distributor and the first compartment, and a mechanical driver in the first compartment that moves between a first position defining a first volume in the first compartment and a second position defining a second volume in the first compartment less than the first volume;

pressurizing the first compartment comprises opening the first inlet valve to flow a first precursor gas into the first compartment until a pressure of the first precursor gas in the first compartment reaches a desired pressure corresponding to the desired mass of a single pulse of the first precursor gas; and driving the gas from the first compartment comprises closing the first inlet valve, opening the outlet valve, and moving the mechanical actuator from the first position to the second position.

19. A method of controlling the delivery of gases in processes for depositing material onto a micro-device workpiece using a reactor comprising a chamber including a gas distributor with outlet ports configured to dispense gas to the workpiece, the method comprising:

pressuring a first compartment of the chamber with a first gas while prohibiting the first gas from flowing from the first compartment through the outlet ports;

opening a fluid passageway between the first compartment and the outlet ports after the first gas reaches a desired pressure in the first compartment; and driving the first gas from the first compartment and through the outlet ports, wherein the reactor further comprises a first inlet valve coupled to a first gas supply and the first compartment, an outlet valve coupled to the outlet ports of the gas distributor and the first compartment, and a mechanical driver in the first compartment that moves between a first position defining a first volume in the first compartment and a second position defining a second volume in the first compartment less than the first volume;

pressurizing the first compartment comprises opening the first inlet valve to flow a first precursor gas into the first compartment until a pressure of the first precursor gas in the first compartment reaches a desired pressure;

driving the gas from the first compartment comprises closing the first inlet valve, opening the outlet valve, and moving the mechanical actuator from the first position to the second position;

the method further comprises pressurizing the first compartment by opening the second valve to flow a second precursor gas into the first compartment until a pressure of the second precursor gas in the first compartment reaches a desired pressure; and the method further comprises driving the second precursor gas by closing the second inlet valve, opening the outlet valve, and moving the mechanical actuator from the first position to the second position.

20. A method of controlling the delivery of gases in processes for depositing material onto a micro-device workpiece using a reactor comprising a chamber including a gas distributor with outlet ports configured to dispense gas to the workpiece, the method comprising:

pressurizing a first compartment of the chamber with a first gas while prohibiting the first gas from flowing from the first compartment through the outlet ports;

opening a fluid passageway between the first compartment and the outlet ports after the first gas reaches a desired pressure in the first compartment; and driving the first gas from the first compartment and through the outlet ports, wherein the reactor further comprises a first inlet valve coupled to a first gas supply of a first precursor and the first compartment, a second inlet valve coupled to a second gas supply of a second precursor and the first compartment, and a third inlet valve coupled to a purge gas and the first compartment, and an outlet valve coupled to the outlet ports of the gas distributor and the first compartment;

pressurizing the first compartment comprises charging the first compartment with the first precursor to a desired pressure by opening the first inlet valve while the second inlet valve, the third inlet valve and the outlet valve are closed;

driving the gas from the first compartment comprises discharging the first precursor from the first compartment by opening the outlet valve and the third inlet valve while first inlet valve and the second inlet valve are closed to flow the purge gas through the first compartment in a manner that drives the first precursor out of the gas dispenser;

pressurizing the first compartment further comprises charging the first compartment with the second precursor to a desired pressure by opening the second inlet valve while the first inlet valve, the third inlet valve and the outlet valve are closed; and driving the gas from the first compartment comprises discharging the second precursor from the first compartment by opening the outlet valve and the third inlet valve while the first inlet valve and, the second inlet valve are dosed to flow the purge gas through the first compartment in a manner that drives the second precursor out of the gas dispenser.

21. A method of controlling the delivery of gases in processes for depositing material onto a micro-device workpiece using a reactor comprising a chamber including a gas distributor with outlet ports configured to dispense gas to the workpiece, the method comprising:

pressurizing a first compartment of the chamber with a first gas while prohibiting the first gas from flowing from the first compartment through the outlet ports;

opening a fluid passageway between the first compartment and the outlet ports after the first gas reaches a desired pressure in the first compartment; and driving the first gas from the first compartment and through the outlet ports, wherein the reactor further comprises a first inlet valve coupled to a first gas supply of a first precursor and the first compartment, a second inlet valve coupled to a second gas supply of a second precursor and the first compartment, and a third inlet valve coupled to a purge gas and the first compartment, and an outlet valve coupled to the outlet ports of the gas distributor and the first compartment;

pressurizing the first compartment comprises charging the first compartment with the first and second precursors to a desired pressure by opening the first and second inlet valves while the third inlet valve and the outlet valve are closed; and driving the gas from the first compartment comprises discharging the first and second precursors from the first compartment by opening the outlet valve and the third inlet valve while first inlet valve and the second inlet valve are closed to flow the purge gas through the first compartment in a manner that drives the first and second precursors out of the gas dispenser.

22. A method of depositing material onto a micro-device workpiece, comprising:

placing a micro-device workpiece having a plurality of submicron features in a reaction chamber of a reactor so that the workpiece is proximate to outlet ports of a gas distributor in the reaction chamber;

flowing a gas from a gas supply to a compartment of the reactor while preventing gas from flowing through the outlet ports until the gas reaches, a desired pressure within the compartment; and dispensing the gas in the chamber through the outlet ports by displacing the gas from the compartment.

23. The method of claim 22 wherein:

the reactor further comprises a first inlet valve coupled to a first gas supply and the compartment, a second inlet valve coupled to a second gas supply and the compartment, and an outlet valve coupled to the outlet ports of the gas distributor and the compartment;

flowing the gas comprises pressurizing the compartment by opening the first inlet valve to flow a first precursor into the compartment until a pressure of the first precursor in the compartment reaches a desired pressure corresponding to the desired mass of a single pulse of the first precursor; and dispensing the gas comprises closing the first inlet valve, opening the outlet valve, and opening the second inlet valve to flow a purge gas into the compartment that drives the first gas out of the compartment.

24. The method of claim 22 wherein:

the reactor further comprises a first inlet valve coupled to a first gas supply and the compartment, an outlet valve coupled to the outlet ports of the gas distributor and the compartment, and a mechanical driver in the compartment that moves between a first position defining a first volume in the compartment and a second position defining a second volume in the compartment less than the first volume;

flowing the gas comprises pressurizing the compartment by opening the first inlet valve to flow a first precursor gas into the compartment until a pressure of the first precursor gas in the compartment reaches a desired pressure corresponding to the desired mass of a single pulse of the first precursor gas; and dispensing the gas comprises closing the first inlet valve, opening the outlet valve, and moving the mechanical actuator from the first position to the second position.

25. The method of claim 22 wherein:

the reactor further comprises a first inlet valve coupled to a first gas supply and the compartment, an outlet valve coupled to the outlet ports of the gas distributor and the compartment, and a mechanical driver in the compartment that moves between a first position defining a first volume in the compartment and a second position defining a second volume in the compartment less than the first volume;

flowing the gas comprises pressurizing the compartment by opening the first inlet valve to flow a first precursor gas into the compartment until a pressure of the first precursor gas in the compartment reaches a desired pressure;

dispensing the gas comprises closing the first inlet valve, opening the outlet valve, and moving the mechanical actuator from the first position to the second position;

the method further comprises pressurizing the compartment by opening the second valve to flow a second precursor gas into the compartment until a pressure of the second precursor gas in the compartment reaches a desired pressure; and the method further comprises dispensing the second precursor gas by closing the second inlet valve, opening the outlet valve, and moving the mechanical actuator from the first position to the second position.

26. The method of claim 22 wherein:

flowing the gas comprises charging a compartment with a first precursor gas to a first pressure; and dispensing the gas from the container comprises moving a mechanical actuator within the compartment from a first position defining a first volume to a second position defining a second volume less that the first volume.

27. The method of claim 22 wherein:

the reactor further comprises a first inlet valve coupled to a first gas supply of a first precursor and the compartment, a second inlet valve coupled to a second gas supply of a second precursor and the compartment, and a third inlet valve coupled to a purge gas and the compartment, and an outlet valve coupled to the outlet ports of the gas distributor and the compartment;

flowing the gas comprises pressurizing the compartment with the first precursor to a desired pressure by opening the first inlet valve while the second inlet valve, the third inlet valve, and the outlet valve are closed;

dispensing the gas from the outlet ports comprises discharging the first precursor from the compartment by opening the outlet valve and the third inlet valve while first inlet valve and the second inlet valve are closed to flow the purge gas through the compartment in a manner that drives the first precursor out of the gas dispenser;

flowing the gas further comprises pressurizing the compartment with the second precursor to a desired pressure by opening the second inlet valve while the first inlet valve, the third inlet valve, and the outlet valve are closed; and dispensing the gas further comprises discharging the second precursor from the compartment by opening the outlet valve and the third inlet valve while the first inlet valve and the second inlet valve are closed to flow the purge gas through the compartment in a manner that drives the second precursor out of the gas dispenser.

28. The method of claim 22 wherein:

the reactor further comprises a first inlet valve coupled to a first gas supply of a first precursor and the compartment, a second inlet valve coupled to a second gas supply of a second precursor and the compartment, a third inlet valve coupled to a purge gas and the compartment, and an outlet valve coupled to the outlet ports of the gas distributor and the compartment;

flowing the gas comprises pressurizing the compartment with the first and second precursors to a desired pressure by opening the first and second inlet valves while the third inlet valve and the outlet valve are closed; and dispensing the gas from the outlet ports comprises discharging the first and second precursors from the compartment by opening the outlet valve and the third inlet valve while first inlet valve and the second inlet valve are closed to flow the purge gas through the compartment in a manner that drives the first and second precursors out of the gas dispenser.

29. The method of claim 22 wherein:

the reactor comprises a first compartment and second compartment, the first compartment being coupled to a supply of a first precursor gas, and the second compartment being coupled to a supply of a second precursor gas;

flowing the gas comprises charging the first compartment with the first precursor gas and charging the second compartment with the second precursor gas;

dispensing the precursor gas comprises (a) driving the first precursor gas from the first compartment using a purge gas and then (b) driving the second precursor gas from the second compartment using a purge gas; and flowing the gas further comprises recharging the first compartment with the first precursor while driving the second precursor from the second compartment and recharging the second compartment while driving the first precursor from the first compartment.

30. A method of depositing material onto a workpiece, comprising: placing a micro-device workpiece having a plurality of submicron features proximate to outlet ports of a gas distributor in a reactor;

flowing a gas from a gas supply to a selectively sealable compartment in the reactor until the gas reaches a desired pressure within the compartment for a pulse of the gas; and dispensing the gas from the outlet ports over the workpiece by opening a valve between the compartment and the outlet ports and physically displacing the gas from the compartment.

31. A method of depositing material onto a workpiece, comprising:

placing a micro-device workpiece having a plurality of submicron features proximate to outlet ports of a gas distributor in a reaction chamber of a reactor;

filling a container of the reactor with a desired mass of a precursor gas while preventing the precursor gas from flowing through the outlet ports of the gas distributor;

actively displacing the precursor gas from the container to flow the precursor gas through the outlet ports of the gas distributor; and dispensing the precursor gas from outlet ports to the workpiece.

32. The method of claim 31 wherein:

the container comprises a compartment, a first inlet valve coupled to a first gas supply, a second inlet valve coupled to a second gas supply, and an outlet valve coupled to the outlet ports of the gas distributor;

filling the container comprises opening the first inlet valve to flow a first precursor into the compartment until a pressure of the first precursor in the compartment reaches a desired pressure corresponding to the desired mass of a single pulse of the first precursor; and actively displacing the precursor gas from the outlet ports comprises closing the first inlet valve, opening the outlet valve, and opening the second inlet valve to flow a purge gas into the compartment that drives the first gas out of the compartment.

33. The method of claim 31 wherein:

the container comprises a compartment, a first inlet valve coupled to a first gas supply, an outlet valve coupled to the outlet ports of the gas distributor, and a mechanical driver in the compartment that moves between a first position defining a first volume in the compartment and a second position defining a second volume in the compartment less than the first volume;

filling the container comprises opening the first inlet valve to flow a first precursor gas into the compartment until a pressure of the first precursor gas in the compartment reaches a desired pressure corresponding to the desired mass of a single pulse of the first precursor gas; and actively displacing the precursor gas from the outlet ports comprises closing the first inlet valve, opening the outlet valve, and moving the mechanical actuator from the first position to the second position.

34. The method of claim 31 wherein:

the container comprises a compartment within the gas distributor, a first inlet valve coupled to a first gas supply, a second inlet valve coupled to a second gas supply, an outlet valve coupled to the outlet ports of the gas distributor, and a mechanical driver in the compartment that moves between a first position defining a first volume in the compartment and a second position defining a second volume in the compartment less than the first volume;

filling the container comprises opening the first inlet valve to flow a first precursor gas into the compartment until a pressure of the first precursor gas in the compartment reaches a desired pressure;

actively displacing the precursor gas from the outlet ports comprises closing the first inlet valve, opening the outlet valve, and moving the mechanical actuator from the first position to the second position;

the method further comprises pressurizing the compartment by opening the second valve to flow a second precursor gas into the compartment until a pressure of the second precursor gas in the compartment reaches a desired pressure; and the method further comprises actively displacing the second precursor gas by closing the second inlet valve, opening the outlet valve, and moving the mechanical actuator from the first position to the second position.

35. The method of claim 31 wherein:

filling a container with gas comprises charging a compartment with a first precursor gas to a first pressure; and actively displacing precursor gas from the container comprises moving a mechanical actuator within the compartment from a first position defining a first volume to a second position defining a second volume less that the first volume.

36. The method of claim 31 wherein:

the container comprises a compartment, a first inlet valve coupled to a first gas supply of a first precursor, a second inlet valve coupled to a second gas supply of a second precursor, a third inlet valve coupled to a purge gas, and an outlet valve coupled to the outlet ports of the gas distributor;

filling the container comprises charging the compartment with the first precursor to a desired pressure by opening the first inlet valve while the second inlet valve, the third inlet valve and the outlet valve are closed;

displacing the precursor gas from the outlet ports comprises discharging the first precursor from the compartment by opening the outlet valve and the third inlet valve while first inlet valve and the second inlet valve are closed to flow the purge gas through the compartment in a manner that drives the first precursor out of the gas dispenser;

filling the container further comprises charging the compartment with the second precursor to a desired pressure by opening the second inlet valve while the first inlet valve, the third inlet valve and the outlet valve are closed; and displacing the precursor gas further comprises discharging the second precursor from the compartment by opening the outlet valve and the third inlet valve while the first inlet valve and the second inlet valve are closed to flow the purge gas through the compartment in a manner that drives the second precursor out of the gas dispenser.

37. The method of claim 31 wherein:

the container comprises a compartment, a first inlet valve coupled to a first gas supply of a first precursor, a second inlet valve coupled to a second gas supply of a second precursor, and a third inlet valve coupled to a purge gas, and an outlet valve coupled to the outlet ports of the gas distributor;

filling the container comprises charging the compartment with the first and second precursors to a desired pressure by opening the first and second inlet valves while the third inlet valve and the outlet valve are closed; and displacing the precursor gas from the outlet ports comprises discharging the first and second precursors from the compartment by opening the outlet valve and the third inlet valve while first inlet valve and the second inlet valve are closed to flow the purge gas through the compartment in a manner that drives the first and second precursors out of the gas dispenser.

38. The method of claim 31 wherein:

the container comprises a first compartment and second compartment, the first compartment being coupled to a supply of a first precursor gas, and the second compartment being coupled to a supply of a second precursor gas;

filling the container comprises charging the first compartment with the first precursor gas and charging the second compartment with the second precursor gas;

actively displacing the precursor gas comprises (a) driving the first precursor gas from the first compartment using a purge gas and then (b) driving the second precursor gas from the second compartment using a purge gas; and filling the container further comprises recharging the first compartment with the first precursor while driving the second precursor from the second compartment and recharging the second compartment while driving the first precursor from the first compartment.

* * * * *

UNITED STATES PATENT AND TRADEMARK OFFICE
CERTIFICATE OF CORRECTION

PATENT NO. : 6,887,521 B2
DATED : May 3, 2005
INVENTOR(S) : Cem Basceri

It is certified that error appears in the above-identified patent and that said Letters Patent is hereby corrected as shown below:

Column 12,
Line 32, "dosed" should be -- closed --;

Column 15,
Line 31, "pressuring" should be -- pressurizing --;

Column 16,
Line 26, "pressuring" should be -- pressurizing --;

Column 17,
Line 34, "dosed" should be -- closed --.

Signed and Sealed this

Fourteenth Day of March, 2006

JON W. DUDAS
*Director of the United States Patent and Trademark Office*